United States Patent
Bosselmann et al.

[11] Patent Number: 5,933,000
[45] Date of Patent: Aug. 3, 1999

[54] PROCESS AND ARRANGEMENT FOR MEASURING A MAGNETIC FIELD USING THE FARADAY EFFECT WITH COMPENSATION FOR VARIATIONS IN INTENSITY AND TEMPERATURE EFFECTS

[75] Inventors: Thomas Bosselmann; Peter Menke, both of Erlangen, Germany

[73] Assignee: Siemens Aktiengesellschaft, München, Germany

[21] Appl. No.: 08/860,992

[22] PCT Filed: Dec. 8, 1995

[86] PCT No.: PCT/DE95/01764

§ 371 Date: Jun. 23, 1997

§ 102(e) Date: Jun. 23, 1997

[87] PCT Pub. No.: WO96/20411

PCT Pub. Date: Jul. 4, 1997

[30] Foreign Application Priority Data

Dec. 23, 1994 [DE] Germany .............................. 44 46 425

[51] Int. Cl.⁶ .................................................. G01R 33/032
[52] U.S. Cl. .................... 324/96; 324/244.1; 324/117 R; 250/225; 356/365; 356/364
[58] Field of Search .................................... 324/96, 244.1, 324/117 R, 750–753; 250/227.17, 227.24, 225, 205; 356/345, 351, 368, 364, 365; 385/12

[56] References Cited

U.S. PATENT DOCUMENTS

| | | | |
|---|---|---|---|
| 4,564,754 | 1/1986 | Sato et al. ................................... | 324/96 |
| 4,683,421 | 7/1987 | Miller et al. ................................ | 324/96 |
| 4,694,243 | 9/1987 | Miller et al. ................................ | 324/96 |
| 4,916,387 | 4/1990 | Miller ........................................ | 324/96 |

FOREIGN PATENT DOCUMENTS

| | | |
|---|---|---|
| 3141325 | 4/1983 | Germany . |
| 3726411 | 2/1989 | Germany . |
| 60-138480 | 7/1985 | Japan . |
| 92/13280 | 8/1992 | WIPO . |

OTHER PUBLICATIONS

D.A. Jackson, "Recent progress in monomode fibre–optic sensors",Meas. Sci. Technol. 5 (1994), pp. 621–631.

Fang et al., "A Reciprocal–Compensated Fiber–Optic Electric Current Sensor", Journal of Lightwave Technology, vol. 12, No. 10, Oct. 1994, pp. 1882–1890.

A. Yu and A.S. Siddiqui, "Practical Sagnac interferometer based fibre optic current sensor", IEEE Proc.–Optoelectron., vol 141, No. 4, Aug. 1994, pp. 249–256.

D.M. Pozar and S.D. Targonski, "Compensation For Temperature Dependence Of Faraday Effect In Diamagnetic Materials: Application To Optical Fibre Sensors", Electronics Letters, Jun. 20, 1991, vol. 27, No. 13, p. 1131.

*Primary Examiner*—Jay M. Patidar
*Attorney, Agent, or Firm*—Kenyon & Kenyon

[57] ABSTRACT

Two light signals pass through a series connection of a first multimode optical fiber, a first polarizer, a Faraday sensor device, a second polarizer an a second multimode optical fiber in opposite directions. The polarization axes of the two polarizers are set at a polarizer angle $\eta$ or $\theta$ to the natural axis of the linear birefringence in the sensor device with $\cos(2\eta+2\theta)=-\tfrac{2}{3}$. The measuring signal is derived as the quotient of two linear functions of the light intensities of the two light signals after passing through the series connection.

11 Claims, 3 Drawing Sheets

PROCESS AND ARRANGEMENT FOR MEASURING A MAGNETIC FIELD USING THE FARADAY EFFECT WITH COMPENSATION FOR VARIATIONS IN INTENSITY AND TEMPERATURE EFFECTS

FIELD OF THE INVENTION

The present invention concerns a process and an arrangement for measuring a magnetic field.

BACKGROUND INFORMATION

Optical measuring arrangements and methods of measuring a magnetic field utilizing the magneto-optic Faraday effect are known. The Faraday effect is defined as the rotation of the plane of polarization of linearly polarized light as a function of a magnetic field. The angle of rotation is proportional to the path integral over the magnetic field along the path traveled by the light with the Verdet constant as a proportionality constant. The Verdet constant depends in general on the material, the temperature, and the wavelength. To measure the magnetic field, a Faraday sensor device made of an optically transparent material such as glass is arranged in the magnetic field. The magnetic field causes the plane of polarization of linearly polarized light passed through the Faraday sensor device to rotate by an angle of rotation that can be analyzed for a measuring signal. Such magneto-optical measuring methods and arrangements are known for use in measuring electric currents. The Faraday sensor device is placed near a current conductor and detects the magnetic field generated by the current in the conductor. The Faraday sensor device generally surrounds the current conductor, so the measuring light travels around the current conductor in a closed path. In this case, the value of the angle of rotation is in good approximation directly proportional to the amplitude of the current to be measured. The Faraday sensor device may be designed as a solid glass ring around the current conductor or it may surround the current conductor in the form of a measuring winding consisting of an optical fiber (fiber coil) with at least one spire.

Advantages of these magneto-optical measuring arrangements and methods, in comparison with traditional inductive current transformers, include electrical isolation and insensitivity to electromagnetic disturbance. In the use of magneto-optic current transformers, however, problems are encountered due to the effects of mechanical vibrations on the sensor device and the optical leads, which can cause changes in intensity that falsify the measurement, as well as the effects of changes in temperature, for example, in the sensor device.

To reduce the effects of vibration on the measurement, it is known that two oppositely directed light signals, i.e., light signals propagating in opposite directions, can be transmitted through a Faraday sensor device. This known measure is based on the idea that the linear birefringences experienced by the two light signals along their common path due to vibrations as a reciprocal effect of the non-reciprocal Faraday effect can be distinguished using suitable signal processing.

In a first known embodiment, two oppositely directed, linearly polarized light signals are transmitted through an optical fiber coil serving as a Faraday sensor device surrounding a current conductor. A twisted fiber or a spun hi-bi fiber (a high-birefringence fiber twisted during the drawing process) is provided as the optical fiber for the fiber coil. In addition to the Faraday effect, the optical fiber also has a circular birefringence that is high in comparison with the Faraday effect. After passing through the sensor device, each of the two light signals is broken down by a polarizing beam splitter into two components polarized normally to one another. A measuring signal corresponding essentially to the quotient of the Faraday measuring angle and the circular birefringence of the fiber, which is thus independent of the linear birefringence in the optical fiber, is derived by signal processing from a total of four light components. The resulting measuring signal is thus largely free of temperature-induced linear birefringence in the sensor device, but the measuring signal still depends on temperature because of the temperature-dependence of the circular birefringence of the fiber. In this known embodiment, the two oppositely directed light signals pass only through the Faraday sensor device along a common light path and are separated again by optical couplers on leaving the Faraday sensor device as shown in International.

In two other known embodiments, two light signals pass through an optical series connection consisting of a first optical fiber, a first polarizer, a Faraday sensor device, a second polarizer, and a second optical fiber in opposite directions. Each light signal is converted to an electric intensity signal by appropriate photoelectric transducers after passing through the optical series connection.

In the first embodiment known from U.S. Pat. No. 4,916,387, a solid glass ring surrounding the current conductor is provided as the Faraday sensor device. The polarization axes of the two polarizers are rotated by a 45° angle to one another. For compensation of unwanted changes in intensity in the optical lead-in fibers with this measuring arrangement which is known from U.S. Pat. No. 4,916,387, it is assumed that the unwanted variations in intensity (noise) and the variations in intensity due to the Faraday effect are additively superimposed with different signs in the two electric intensity signals and thus can be separated. However, an indepth physical analysis leads to the result that mechanical movements of the two optical fibers for transmitting the two light signals essentially act as time-variable attenuation factors in the light intensities of the two light signals. U.S. Pat. No. 4,916,387 does not indicate how such different attenuation factors in the two optical fibers can be compensated.

In the second embodiment, which is known from the *Journal of Lightwave Technology,* vol. 12, no. 10, October 1994, pages 1882–1890, a fiber coil consisting of a single-mode fiber with a low birefringence is provided as the Faraday sensor device. The polarization axes of the two polarizers together form a polarizer angle that is different from 0°, preferably 45°. Light from a single light source is split into two light signals and these signals are injected into the respective optical fiber through an optical coupler. A measuring signal corresponding to the quotient of the difference between the two intensity signals and the sum of the two intensity signals is derived from the two electric intensity signals that correspond to the light intensities of the respective light signals after passing through the series connection. Thus the attenuation factors of the two optical fibers can be essentially compensated. However, the light intensities of the two light signals must be set exactly the same when injected into the series connection.

Compensation of temperature effects on the measuring signal is not described in U.S. Pat. No. 4,916,387 or in the *Journal of Lightwave Technology,* vol. 12, no. 10, October 1994, pages 1882–1890. Instead, temperature-insensitive fiber coils are used as the sensor device. However, the manufacture of such fiber coils is comparatively problematical.

SUMMARY OF THE INVENTION

An object of the present invention is to provide a measuring arrangement and a method of measuring a magnetic field and in particular for measuring an electric current by measuring its magnetic field, where variations in intensity in the optical transmission links for two oppositely directed light signals and effects of variations in temperature are practically eliminated.

This object and others are achieved according to the present invention as hereinafter explained. Two light signals pass in opposite directions of travel through an optical series connection consisting of a first optical transmission link, a first polarizer, a Faraday sensor device, a second polarizer and a second optical transmission link. The quotient of two linear functions of the light intensities of the two light signals after each passes through the optical series connection is determined by the analyzing devices as the measuring signal for the magnetic field. This measuring signal is essentially independent of intensity variations in the two optical transmission links but is generally still dependent on the temperature in the sensor device in particular. For compensation of temperature effects on the measuring signal, the polarization axis (transmission axis) of the first polarizer is then set at a first polarizer angle η to a natural axis (main axis) of the linear birefringence in the Faraday sensor device and the polarization axis of the second polarizer is set at a second polarizer angle θ to this natural axis in the sensor device. Both polarizer angles η and θ are selected so they at least approximately satisfy the equation:

$$\cos(2\eta + 2\theta) = -2/3 \qquad (1)$$

BRIEF DESCRIPTION OF THE DRAWINGS

Corresponding parts are labeled with the same reference numbers.

DETAILED DESCRIPTION

Figure 1:
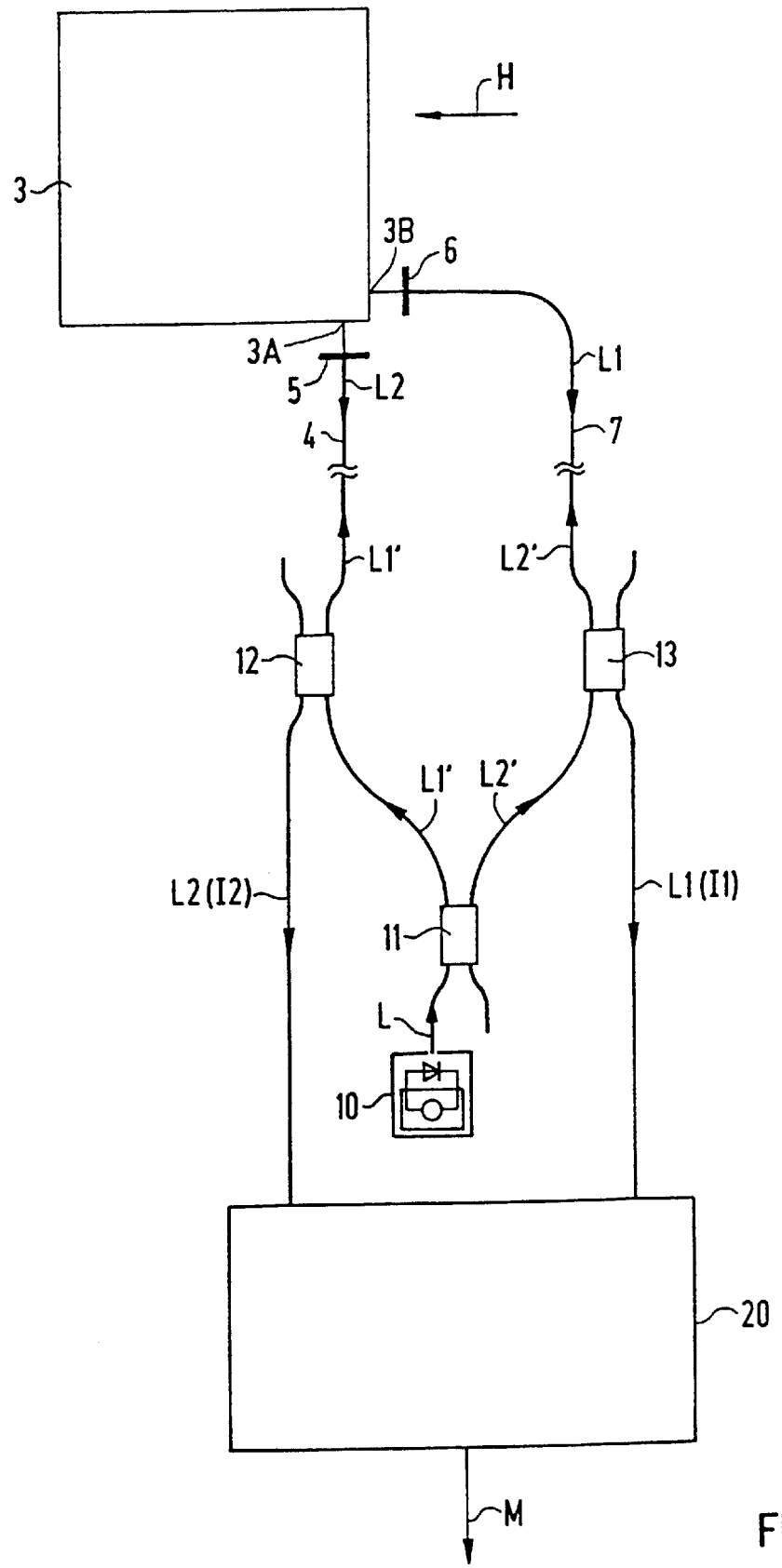
FIG. 1 shows a measuring arrangement for measuring a magnetic field or an electric current with a Faraday sensor device.
Figure 2:
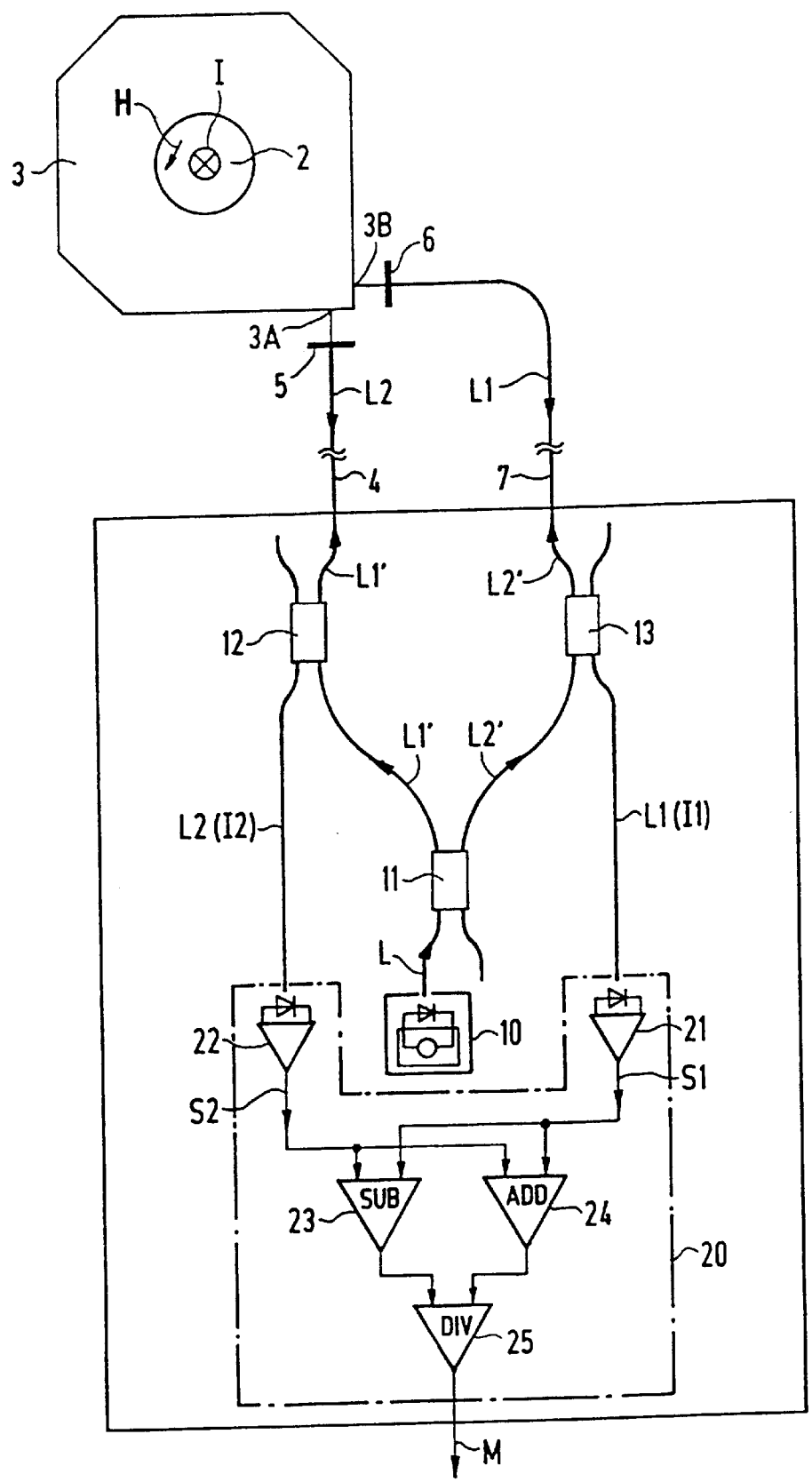
FIG. 2 shows a measuring arrangement for measuring an electric current with a Faraday sensor device and special analyzing devices.

FIGS. 1 and 2 show a Faraday sensor device 3, two optical transmission links 4 and 7, two polarizers 5 and 6, a light source 10, three optical couplers 11, 12 and 13 and analyzing devices 20.

Faraday sensor device 3 is made of at least one material that has a magneto-optical Faraday effect. Under the influence of a magnetic field H passing at least partially through sensor device 3, the polarization of polarized light passing through sensor device 3 is altered due to the Faraday effect. Sensor device 3 may be designed in a known way with one or more solid bodies, preferably made of glass, or with at least one optical fiber.

Sensor device 3 has two optical connections 3A and 3B so that light injected at a connection 3A or 3B passes through sensor device 3 and is output at the other connection 3B or 3A. The first connection 3A of sensor device 3 is optically coupled to one end of the first optical transmission link 4 over the first polarizer 5. The second connection 3B of sensor device 3 is optically coupled to one end of the second optical transmission link 7 over the second polarizer 6. The other end of the first transmission link 4 facing away from sensor device 3 is optically connected to optical coupler 11 as well as analyzing devices 20 over optical coupler 12. The other end of the second transmission link 7 facing away from sensor device 3 is likewise connected optically to both optical coupler 11 and analyzing devices 20 over optical coupler 13. Optical coupler 11 is optically connected to light source 10 and it splits light L of light source 10 into two light signals L1' and L2' that are sent to couplers 12 and 13 and then injected into the first and second transmission links 4 and 7. Both light signals L1' and L2' pass through the optical series connection of the first transmission link 4, first polarizer 5, sensor device 3, second polarizer 6 and second transmission link 7 in opposite directions and are output then from the series connection as light signals L1 and L2. Light source 10 and the three optical couplers 11, 12 and 13 thus form the means for sending two light signals L1 and L2 through the series connection in opposite directions.

Couplers 11, 12 and 13 may be replaced at least in part by optical beam splitters. In addition, instead of coupler 11 and one light source 10, two light sources may also be provided, each transmitting one light signal L1' and L2', respectively. The means for transmitting two light signals L1 and L2 through the series connection in opposite directions may also be formed by two photoelectric transducers that are operated alternately as transmitter and receiver which are also provided for converting light signals L1 and L2 to electric intensity signals after passing through the series connection.

The first light signal L1 is polarized linearly by the first polarizer 5 after passing through the first transmission link 4 and is fed into sensor device 3 at connection 3A as linearly polarized light signal L1'. In its passage through sensor device 3, the plane of polarization of the linearly polarized first light signal L1' is rotated by a Faraday measuring angle ρ that depends on magnetic field H. It is assumed that a positive angle value corresponds to the mathematically positive direction of rotation, i.e., the counterclockwise direction, whereas a negative angle value corresponds to the mathematically negative direction of rotation, i.e., the clockwise direction, based on the direction of propagation of the light signal in question. The first light signal L1' whose plane of polarization has been rotated by measuring angle ρ is then sent to the second polarizer 6. The second polarizer 6 allows only that portion of the incoming first light signal L1' that is projected onto its polarization axis to pass through, and thus it has the function of a polarization analyzer for the first light signal L1'. The portion of the first light signal L1' transmitted by the second polarizer 6 is designated as L1 and is transmitted to analyzing devices 20 over the second transmission link 7 and coupler 13.

The second light signal L2' first passes through the second transmission link 7 and is then linearly polarized by the first polarizer 5. The second linearly polarized light signal L2' is injected into sensor device 3 at connection 3A. In its passage through sensor device 3, the plane of polarization of the second linearly polarized light signal L2' is rotated by a Faraday measuring angle −ρ that depends on the magnetic field H and has the same value as that of the first light signal L1', but has the opposite sign because of the non-reciprocal property of the Faraday effect. The second light signal L2' whose plane of polarization has been rotated by measuring angle −ρ is then sent to the second polarizer 6. Second polarizer 6 allows only the component of the second incoming light signal L2' that is projected onto its polarization axis to pass through and it thus acts as a polarization analyzer for second light signal L2'. The component of second light signal L2' transmitted by second polarizer 6 is designated as L2 and is transmitted to analyzing devices 20 over the first transmission link 4 and coupler 12.

Figure 3:
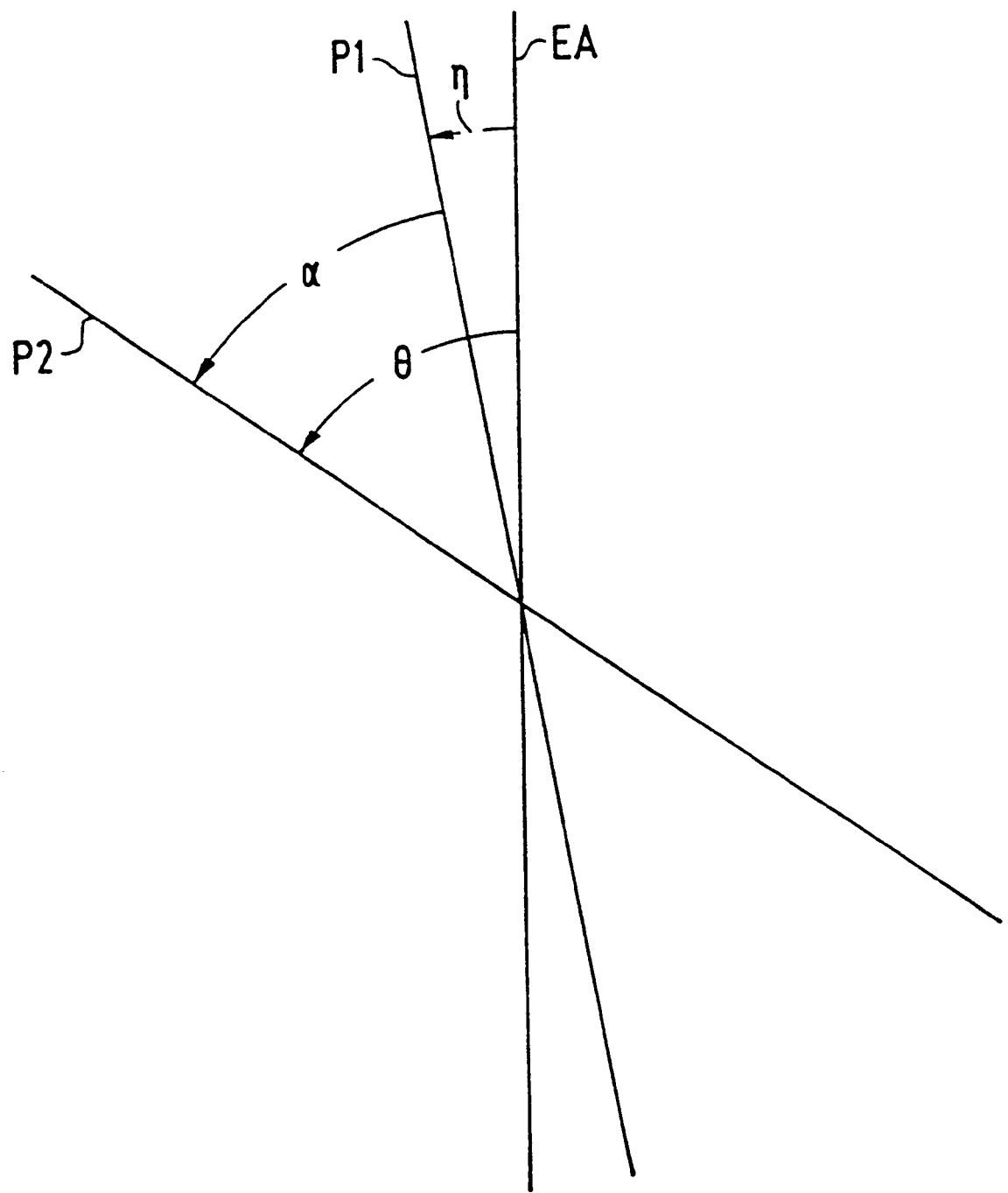
FIG. 3 shows the polarization axes of the two polarizers and a natural axis of the linear birefringence in the sensor device.

According to FIG. 3, the polarization axes (transmission axes) P1 and P2 of the two polarizers 5 and 6 form an angle α that is not equal to an integral multiple of 180° or π, based on the direction of transit of light signal L1' or L2'. Thus polarization axes P1 and P2 of the two polarizers 5 and 6 are not parallel.

In an especially advantageous embodiment, this angle α between polarization axes P1 and P2 of the two polarizers 5 and 6 is at least approximately equal to +45° or −45, i.e., +π/4 or −π/4. The working point for H=0 is then set in a range of optimum linearity and measurement sensitivity.

Light intensities I1' and I2' of the two light signals L1' and L2', before injection into the series connection, are generally set in a fixed ratio to one another. The two light intensities are preferably equal, i.e., I1'=I2'. In the embodiments illustrated here, coupler 11 splits the light L of light source 10 into two equal parts with a coupling ratio of 50:50 (%).

In passing through the two transmission links 4 and 7, both light signals L1'/L1 and L2'/L2 undergo the same intensity variations, which can be caused in particular by attenuation losses due to mechanical vibrations. These intensity variations affect light intensities I1 and I2 essentially in the form of attenuation factors. The real attenuation factor, generally time-dependent, of an optical transmission link is defined as the ratio of the intensity of light arriving at one end of the transmission link to the intensity of the light input into the other end of the transmission link. Let A be the real attenuation factor of the first transmission link 4 and let B be the attenuation factor of the second transmission link 7. Then the following general equations describe light intensities I1 and I2 of the two light signals L1 and L2 after passing through the optical series connection:

$$I1 = I0 \cdot A \cdot B \cdot \cos^2(\rho + \alpha) \tag{2}$$

$$I2 = K \cdot I0 \cdot B \cdot A \cdot \cos^2(\rho + \alpha) \tag{3}$$

I0 is a fixed predefined starting intensity, K is a coupling factor derived from the coupling ratios of couplers 11, 12 and 13 in the embodiment illustrated here. If the coupling ratios of all couplers 11, 12 and 13 are 50:50 (%), then K=1. The $\cos^2$ terms in equations (2) and (3) describe the dependence of light intensity I1 or I2 on the Faraday measuring angle ρ for a predefined angle α between the two polarization axes of the two polarizers 5 and 6. The factors in front of the $\cos^2$ terms in the expressions for the two light intensities I1 and I2 according to equations (2) and (3) differ only in coupling factor K.

Attenuation factors A and B of transmission links 4 and 7 are now eliminated by the fact that analyzing devices 20 derive a quotient signal of the form:

$$M = (a \cdot I1 + b \cdot I2 + c)/(d \cdot I1 + e \cdot I2 + f) \tag{4}$$

Where measuring signal M for magnetic field H is derived from two linear functions $a \cdot I1 + b \cdot I2 + c$ and $d \cdot I1 + e \cdot I2 + f$ of the two light intensities I1 and I2 with real coefficients a, b, c, d, e and f. At least either coefficients a and e or coefficients b and d are different from zero.

This measuring signal M according to equation (4) is practically independent of intensity variations caused by vibrations, in particular, in transmission links 4 and 7. Thus, simple and comparatively inexpensive telecommunications optical fibers (multimode fibers) can also be used as transmission links 4 and 7 in all embodiments because their relatively high attenuation and vibration sensitivity are compensated in measuring signal M. However, other optical fibers or free beam arrangements can also be used as transmission links 4 and 7.

Coefficients a, b, c, d, e and f of the linear functions in the numerator and denominator in equation (4) may be adapted to different input intensities of the two light signals on injection into the series connection. Coefficients a, b, c, d, e and f for light intensities I1 and I2 determined according to equations (2) and (3) are preferably adapted so as to yield a measuring signal that is essentially proportional to the sine of two times the Faraday measuring angle ρ

$$M \sim \sin(2\rho) \tag{5}$$

without taking into account linear birefringence effects in sensor device 3. Coefficients d, e and f of linear function $d \cdot I1 + e \cdot I2 + f$ in the denominator of the quotient according to equation (4) are preferably set so that linear function $d \cdot I1 + e \cdot I2 + f$ remains practically constant and is thus independent of magnetic field H.

In a special embodiment, a quotient $$M = I1/I2 = \cos^2(\rho+\alpha)/(K \cdot \cos^2(\rho-\alpha)) \tag{6a}$$

or $$M = I2/I1 = (K \cdot \cos^2(\rho-\alpha))/\cos^2(\rho+\alpha) \tag{6b}$$

of the two light intensities I1 and I2 is used us measuring signal M. This quotient according to equation (6a) or (6b) is derived from the general quotient according to equation (4) when coefficients a=e=1 and b=c=d=f=0 or a=c=e=f=0 and b=d=1 are selected. This measuring signal M is a relatively complex but unique function of measuring angle ρ and thus of magnetic field H.

In particular in an advantageous embodiment with at least approximately equal input intensities I1' and I2' of two light signals L1' and L2', the quotient $$M = (I1-I2)/(I1+I2) \tag{7}$$

of the difference I1−I2 (or I2−I1) and the sum I1+I2 of the two light intensities I1 and I2 after passing through the series connection can be used as measuring signal M. This measuring signal M is then in turn proportional to sin(2ρ) if there are no linear birefringence effects in sensor device 3.

Measuring signal M which has been cleared of attenuation factors A and B of transmission links 4 and 7 can be derived by analyzing devices 20 by various methods from the two light intensities I1 and I2 of the two oppositely directed light signals L1 and L2. In general, each light signal L1 and L2 is first converted photoelectrically by analyzing devices 20 into an electric intensity signal that is a direct measure of light intensity I1 and I2 of light signal L1 and L2, respectively. Measuring signal M is determined from these two electric intensity signals with the help of a table of values or by calculation. Analyzing devices 20 contain appropriate analog or digital modules for this purpose.

In an embodiment not illustrated here, the two electric intensity signals are first digitized by an analog-digital converter and the digitized signals are processed further by a microprocessor or a digital signal processor according to one of equations (4), (6a), (6b) or (7).

Analog components, which are usually faster than digital components, can also be used in particular for calculation of measuring signal M as a predefined function M(I1, I2) of the two light intensities I1 and I2 according to equation (4), (6a), (6b) or (7).

FIG. 2 illustrates one embodiment of the measuring arrangement containing analyzing devices 20 with analog components. In this embodiment, analyzing devices 20 consist of two photoelectric transducers 21 and 22, a subtracter 23, an adder 24 and a divider 25. First transducer 21 is optically connected to coupler 13 and converts the first light signal L1, after it has passed through the series connection, to a first electric intensity signal S1 whose signal intensity corresponds to light intensity I1 of the first light signal L1. The second transducer 22 is optically connected to coupler 12 and converts the second light signal L2, after it has passed through the series connection, to a second electric intensity signal S2 as a measure of light intensity I2 of second light signal L2. Each electric intensity signal S1 and S2 is sent to one input of subtracter 23 and one input of adder 24. Differential signal S1−S2 (or S2−S1) at the output of subtracter 23 and summation signal S1+S2 at the output of adder 24 are each sent to an input of divider 25. The output signal of the divider (S1−S2)/(S1+S2) is used as measuring signal M and is available at an output of analyzing devices 20. This measuring signal M thus corresponds to equation (7).

A measuring signal M that satisfies the more general equation (4) can be obtained easily with the help of analog components in an embodiment that is not illustrated here by additionally connecting an amplifier upstream from each input of subtracter 23 and adder 24, adapting the gain factors of these amplifiers to the corresponding coefficients a, −b for negative b, d, and e of the two linear functions in equation (4), and providing additional adders for adding coefficient c to the output signal of subtracter 23 according to the numerator in equation (4) and coefficient f to the output signal at the output of adder 24 according to the denominator in equation (4). The output signals of the two other adders are then supplied to the inputs of divider 25. If b is positive, another adder is preferably used instead of subtracter 23.

By adjusting coefficients a, b, c, d, e, and f for measuring signal M formed according to equation (4), different sensitivities of two photoelectric transducers 21 and 22 can also be compensated in particular.

The measurement arrangement according to FIG. 2 is preferably provided for measuring an electric current I in at least one current conductor 2. Faraday sensor device 3 detects magnetic field H that is generated by this current I by inductance and it rotates the planes of polarization of the two light signals L1' and L2' by a measuring angle ρ or −ρ which depends on magnetic field H and thus on current I. In an especially advantageous embodiment illustrated in FIG. 2, sensor device 3 surrounds current conductor 2 so that two light signals L1' and L2' travel around the current I in a practically closed light path. In this case, measuring angle ρ is directly proportional to electric current I. Sensor device 3 may be designed as a solid glass ring with internal reflective surfaces that deflect light signals L1' and L2' or in any other known manner. Analyzing devices 20 derive a measuring signal M for electric current I from light intensities I1 and I2 of two light signals L1 and L2 after they pass through the series connection, this measuring signal being largely independent of intensity variations in the two transmission links 4 and 7.

Temperature effects in sensor device 3 are one problem in measuring a magnetic field H or an electric current I according Lo one of the measuring arrangements or methods described here. These temperature effects induce a linear birefringence δ as a function δ(T) of temperature T in sensor device 3, which can distort the measurement of magnetic field H or electric current I. Furthermore, temperature variations can also affect the Verdet constant and thus the measurement sensitivity.

This temperature dependence of measuring signal M is essentially eliminated by the measures described below for temperature compensation. Polarization axis P1 of first polarizer 5 is set at a first polarizer angle η to a natural axis (main axis, optical axis) EA of linear birefringence δ in sensor device 3, and polarization axis P2 of the second polarizer 6 is set at a second polarizer angle θ to natural axis EA of linear birefringence δ in sensor device 3 (see FIG. 3). The two polarizer angles η and θ are determined at least approximately by the equation given above $$\cos(2\theta+2\eta)=-\tfrac{2}{3} \tag{1}$$

A natural axis of linear birefringence δ is defined as the polarization direction at which linearly polarized light injected into sensor device 3 leaves sensor device 3 again practically unchanged. However, if linearly polarized light is injected into sensor device 3 with a plane of polarization not parallel to one of the natural axes of sensor device 3, the light is elliptically polarized in passing through sensor device 3 because of linear birefringence δ. The two natural axes of linear birefringence δ which are generally orthogonal to one another can be determined in a known way. For example, sensor device 3 may be arranged between a polarizer, e.g., polarizer 5, and an analyzer, e.g., polarizer 6. The polarization axes of the two polarizers are set normal to one another. In one embodiment, the two polarization axes of the polarizer and analyzer are rotated in the same direction in relation to a reference axis of sensor device 3 until the intensity of the light transmitted by the analyzer is zero (maximum light extinction). The natural axes are then parallel to the two polarization axes of the polarizer and analyzer. As an alternative, in another embodiment the two polarization axes may also be rotated in the same direction in relation to the reference axis of sensor device 3 until reaching the maximum intensity of the light transmitted by the analyzer (minimum light extinction). In this case, the light is circularly polarized on leaving sensor device 3. The natural axes of linear birefringence δ are then offset by 45° and −45° to the polarization axis of the analyzer.

Deviations from the angle values for the two polarizer angles η and θ that exactly satisfy equation (1) are possible, in particular at a high linear and/or circular birefringence in sensor device 3, and may amount to as much as approximately 5° in general. It follows from equation (1) in particular that polarization axes P1 and P2 of the two polarizers 5 and 6 are not parallel to the natural axis EA of linear birefringence δ in sensor device 3.

Angle α between the two polarization axes of the two polarizers 5 ant 6 is equal to the difference η−θ or θ−η, depending on whether the direction of passage of the first light signal L1' or the second light signal L2' is selected as the reference system and taking into account the sign of the two polarizer angles η and θ taking into account the mathematical direction of rotation. The differential angle α is preferably set so that the following equation holds at least approximately:

$$\sin(2\alpha)=\sin(\pm 2(\theta-\eta))=\pm 1 \tag{8}$$

Polarizer angles η and θ which satisfy this equation (8) correspond to the above-mentioned embodiment, where differential angle α is set at its preferred value of +45° or −45°. For example, η=10.45° and θ=55.45°, as illustrated in FIG. 3, can selected as the angle values for the two polarizer angles η and θ that satisfy both equation (1) and (8).

Measuring signal M which is determined with polarizer angles η and θ that are set at least approximately according to equation (1) corresponds essentially to the measuring signal without linear birefringence δ even with variable temperatures in sensor device 3, i.e., a quantity proportional to sin(2ρ) according to equation (5) in the case of a measuring signal M derived according to equation (4) or (7).

In a special embodiment, the two polarizer angles η and θ of the two polarizers 5 and 6 that are optimal according to equation (1) are set simply so that in a calibration measurement, measuring signal M in its dependence on temperature is compared with its expected theoretical value without linear birefringence δ, in particular according to equation (5), for two predefined polarizer angles η and θ as parameters, and the two polarizer angles η and θ are varied until the current measuring signal M matches the setpoint which is practically independent of temperature.

One advantage of temperature compensation by setting polarizer angles η and θ is the large band width in measuring magnetic fields H or electric currents I. The frequency spectrum of magnetic fields H or electric currents I to be measured is not limited in principle by the measures for temperature compensation.

What is claimed is:

1. A process for measuring a magnetic field with a sensor device that exhibits the Faraday effect, comprising the steps of:

passing a first light signal in a first direction through an optical series connection consisting of a first optical transmission link, a first polarizer, the sensor device, a second polarizer and a second optical transmission link;

passing a second light signal through the optical series connection in a second direction opposite to the first direction;

setting a first polarization axis of the first polarizer so that the first polarization axis is rotated by a first polarizer angle in relation to a natural axis of a linear birefringence in the sensor device;

setting a second polarization axis of the second polarizer so that the second polarization axis is rotated by a second polarizer angle in relation to the natural axis of the linear birefringence in the sensor device, wherein the first and second polarizer angles substantially satisfy the equation cosine(2·first polarizer angle+ 2·second polarizer angle)=−2/3; and determining a measuring signal for the magnetic field, the measuring signal corresponding to a first quotient of two linear functions of a pair of light intensities of the first and second light signals after each has passed through the optical series connection.

2. The process according to claim 1, wherein the measuring signal is proportional to a second quotient of a difference between the pair of light intensities divided by a sum of the pair of light intensities.

3. The process according to claim 1, wherein the measuring signal is proportional to a third quotient equaling one of the pair of light intensities divided by the other.

4. The process according to claim 1, further comprising the steps of:

setting a first polarizer angle of the first polarizer axis of the first polarizer in relation to the natural axis of the linear birefringence in the sensor device; and setting a second polarizer angle of the second polarizer axis of the second polarizer in relation to the natural axis of the linear birefringence in the sensor device;

wherein the first and second polarizer angles substantially satisfy the equation sine(2·second polarizer angle− 2·first polarizer angle)=±1.

5. The process according to claim 1, further comprising the steps of:

measuring a magnetic field of an electric current; and using the measuring signal as a measure of the electric current.

6. An arrangement for measuring a magnetic field comprising:

an optical series connection comprising a first optical transmission link, a first polarizer, a sensor device that exhibits the Faraday effect, a second polarizer and a second optical transmission link;

means for transmitting a first light signal and a second light signal through the series connection so that the first light signal and the second light signal pass through the series connection in opposite directions; and at least one analyzing device for deriving a measuring signal for the magnetic field that corresponds to a first quotient equaling one of two linear functions, of a pair of light intensities of the first and second light signals after each has passed through the optical series connection, divided by the other, wherein a first polarization axis of the first polarizer is rotated by a first polarizer angle in relation to a natural axis of the linear birefringence in the sensor device and a second polarization axis of the second polarizer is rotated by a second polarizer angle in relation to the natural axis, the first and second polarizer angles substantially satisfying the equation cosine(2·first polarizer angle+2·second polarizer angle)=−2/3.

7. The arrangement according to claim 6, wherein the first and the second optical transmission links are formed by a plurality of multimode optical fibers.

8. The arrangement according to claim 6, wherein the at least one analyzing device derives a measuring signal that is proportional to a second quotient equaling a difference between the pair of light intensities divided by a sum of the pair of light intensities.

9. The arrangement according to claim 6, wherein the at least one analyzing device derives a measuring signal that is proportional to a third quotient equaling one of the pair of light intensities divided by the other.

10. The arrangement according to claim 6, wherein the first and second polarizer angles of the first and second polarization axes of the first and second polarizers are set in relation to the natural axis of the linear birefringence in the sensor device substantially according to the equation sine (2·second polarizer angle−2·first polarizer angle)=±1.

11. The arrangement according to claim 6, wherein the sensor device is arranged in the magnetic field of an electric current and the at least one analyzing device derives the measuring signal as a measure of the electric current.

* * * * *